United States Patent
Prechtl et al.

(10) Patent No.: US 10,326,441 B2
(45) Date of Patent: Jun. 18, 2019

(54) ACTIVE GATE-SOURCE CAPACITANCE CLAMP FOR NORMALLY-OFF HEMT

(71) Applicant: Infineon Technologies Austria AG, Villach (AT)

(72) Inventors: Gerhard Prechtl, Rosegg (AT); Severin Kampl, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/886,497

(22) Filed: Feb. 1, 2018

(65) Prior Publication Data
US 2018/0159528 A1  Jun. 7, 2018

Related U.S. Application Data

(63) Continuation of application No. 15/048,195, filed on Feb. 19, 2016, now Pat. No. 9,917,578.

(51) Int. Cl.
*H03K 3/00* (2006.01)
*H03K 17/30* (2006.01)
(Continued)

(52) U.S. Cl.
CPC ..... *H03K 17/302* (2013.01); *H01L 23/49541* (2013.01); *H01L 23/49575* (2013.01); *H01L 23/49582* (2013.01); *H01L 25/0655* (2013.01); *H01L 25/0657* (2013.01); *H01L 29/778* (2013.01); *H03K 5/084* (2013.01); *H03K 17/063* (2013.01); *H01L 23/49551* (2013.01); *H01L 23/49562* (2013.01);
(Continued)

(58) Field of Classification Search
CPC .... H03K 17/302; H03K 17/063; H03K 5/084; H03K 2017/066; H01L 23/49575; H01L 29/778; H01L 23/49582; H01L 25/0655; H01L 25/0657; H01L 23/49541; H01L 2224/49113; H01L 2224/49111; H01L 2224/48257; H01L 2224/48247; H01L 2224/48137; H01L 23/49562; H01L 23/49551
See application file for complete search history.

(56) References Cited

U.S. PATENT DOCUMENTS 4,500,801 A   2/1985 Janutka et al.
4,691,129 A   9/1987 Einzinger et al.
(Continued)

*Primary Examiner* — Kenneth B Wells
(74) *Attorney, Agent, or Firm* — Murphy, Bilak & Homiller, PLLC

(57) ABSTRACT

A semiconductor assembly includes a first FET having gate, source and drain terminals, a switching device being configured to electrically short a gate-source capacitance of the first FET responsive to a control signal, a first gate lead, a second gate lead, a drain lead, and a source lead. The first and second gate leads, the drain lead, and the source lead form externally accessible terminals of the semiconductor assembly. A reverse blocking rating of the switching device is less than a reverse blocking rating of the first FET. A gate of the first FET is directly electrically connected to the first gate lead. A gate of the switching device is directly electrically connected to the second gate lead. The first FET and the switching device are the only active semiconductor devices connected between the first gate lead, the second gate lead, the drain lead, and the source lead.

11 Claims, 10 Drawing Sheets

(51) Int. Cl.
    *H01L 29/778*     (2006.01)
    *H01L 25/065*     (2006.01)
    *H01L 23/495*     (2006.01)
    *H03K 5/08*     (2006.01)
    *H03K 17/06*     (2006.01)

(52) U.S. Cl.
    CPC ............... *H01L 2224/48137* (2013.01); *H01L 2224/48247* (2013.01); *H01L 2224/48257* (2013.01); *H01L 2224/49111* (2013.01); *H01L 2224/49113* (2013.01); *H03K 2017/066* (2013.01)

(56) References Cited

U.S. PATENT DOCUMENTS

| | | |
|---|---|---|
| 4,893,158 A | 1/1990 | Mihara et al. |
| 4,896,199 A | 1/1990 | Tsuzuki et al. |
| 4,928,053 A | 5/1990 | Sicard et al. |
| 4,952,827 A | 8/1990 | Leipold et al. |
| 5,187,632 A | 2/1993 | Blessing et al. |
| 5,523,714 A | 6/1996 | Topp et al. |
| 5,559,452 A | 9/1996 | Saito et al. |
| 5,592,117 A | 1/1997 | Nadd et al. |
| 5,594,378 A | 1/1997 | Kruse et al. |
| 5,656,968 A | 8/1997 | Sander et al. |
| 5,815,358 A | 9/1998 | Tihanyi et al. |
| 5,910,738 A | 6/1999 | Shinohe et al. |
| 6,088,208 A | 7/2000 | Yamaguchi et al. |
| 7,116,153 B2 | 10/2006 | Pai et al. |
| 7,221,195 B2 | 5/2007 | Bhalla et al. |
| 7,782,099 B2 | 8/2010 | Kawamura |
| 7,834,669 B2 | 11/2010 | Nakahara et al. |
| 8,471,545 B2 | 6/2013 | Couleur et al. |
| 9,112,494 B2 | 8/2015 | Kartal |
| 9,917,578 B2 * | 3/2018 | Prechtl ................ H01L 25/0657 |

\* cited by examiner

ACTIVE GATE-SOURCE CAPACITANCE CLAMP FOR NORMALLY-OFF HEMT

PRIORITY CLAIM

This application is a continuation of and claims priority to U.S. patent application Ser. No. 15/048,195 filed on Feb. 19, 2016, the content of said application incorporated herein by reference in its entirety.

TECHNICAL FIELD

The instant application relates to III-nitride transistors, and more particularly to controlling the gate voltage of III-nitride transistors.

BACKGROUND

One non-deal behavior of transistors is the so-called "spurious turn-off" and spurious turn-on" effects. These effects refer to an unintended switching behavior caused by negative voltage feedback on the gate during a switching event. Spurious turn-off occurs during a switch ON operation. Although the device receives a positive voltage (in the case of a positive threshold device) that is intended to turn the device ON, feedback produced by the switching operation lowers the voltage at the gate. It the feedback is large enough, this negative voltage will drop the gate voltage below the threshold of the device and induce a turn OFF operation, i.e., cause the opposite of what is intended. A symmetrical effect occurs during a switch from ON to OFF, i.e., the device momentarily turns back ON.

Spurious turn-off and turn-on can occur in high power applications, e.g., applications that require switching of large voltages, such as 200V, 400V or more as well as medium or low power applications, e.g., applications that require switching of 20V or less. In high power applications, the relatively large voltage that appears at the output terminals (e.g., drain-source terminals) of the transistor will rapidly decrease during a turn ON operation, and vice-versa. Thus, a large dv/dt signal will appear at the output terminals of the transistor. The $C_{GS}$ (gate source capacitance) and the $C_{GD}$ (gate drain capacitance) of the transistor appear as a capacitive voltage divider to this dv/dt. As a result, the gate capacitor of the transistor charges.

Power HEMTs (high-electron-mobility transistors) are generally preferred in power switching applications due to their favorable power density, on-state resistance, switching frequency, and efficiency benefits over silicon MOSFETs, for example. An HEMT is a transistor with a heterojunction between two materials having different band gaps, such as GaN and AlGaN. In a GaN/AlGaN based HEMT, a two-dimensional electron gas (2DEG) arises near the interface between the AlGaN barrier layer and the GaN buffer layer. In an HEMT, the 2DEG forms the channel of the device. Without further measures, the heterojunction configuration leads to a self-conducting, i.e., normally-on, transistor. A variety of solutions exist to modify this normally-on configuration into a normally-off device. For example, p-type GaN material can be incorporated into the gate structure of the HEMT to make the device a normally-off device.

Spurious turn-off and turn-on is especially difficult to control in HEMT devices. In general, an increase in $C_{GS}$ or $V_{th}$ (threshold voltage) will mitigate the problem, as the device can absorb more charge before reaching the threshold. This is difficult to achieve and/or costly in HEMTs due to the design of the gate structure. The problem can also be addressed by through design of the gate driver circuitry. However, in many applications, the driver circuitry is provided externally. In that case, parasitic inductances and capacitances that appear between the driver circuitry and the power transistor may make it difficult or impossible to rapidly dissipate charges from the gate of the device.

SUMMARY

Those skilled in the art will recognize additional features and advantages upon reading the following detailed description, and upon viewing the accompanying drawings.

A semiconductor assembly is disclosed. According to an embodiment, the semiconductor assembly includes a first FET integrated within the semiconductor assembly and comprising gate, source and drain terminals, a switching device integrated within the semiconductor assembly and being configured to electrically short a gate-source capacitance of the first FET responsive to a control signal, a first gate lead, a second gate lead, a drain lead, and a source lead, each of the first gate lead, the second gate lead, the drain lead, and the source lead forming externally accessible terminals of the semiconductor assembly. A reverse blocking rating of the switching device is less than a reverse blocking rating of the first FET. A gate of the first FET is directly electrically connected to the first gate lead. A gate of the switching device is directly electrically connected to the second gate lead. The first FET and the switching device are the only active semiconductor devices connected between the first gate lead, the second gate lead, the drain lead, and the source lead.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, a semiconductor assembly is provided with a first field-effect transistor (FET) and a low voltage switching device integrated in the same semiconductor package. The low voltage switching device may be monolithically integrated in the same die as the first FET or alternatively may be provided in a separate die. The low voltage switching device is connected to the first FET in a clamping configuration so as to stabilize the gate voltage of the first FET. More particularly, the output terminals of the low voltage switching device (e.g., source and drain terminals) are connected across the input terminals (e.g., gate and source terminals) of the first FET. In this way, the low voltage switching device can be operated to avoid a spurious turn-on or turn-off of the first FET. When the first FET is in the OFF state, the low voltage switching device is ON and therefore maintains the gate-source voltage $V_{GS}$ of the first FET at zero. In this state, the gate-source capacitor $C_{GS}$ of the first FET is electrically shorted. When the first FET is in the ON state, the low voltage switching device is OFF and maintains the $V_{GS}$ of the first FET above threshold.

The low voltage switching device is advantageously placed within the package near the first FET. This minimizes parasitic inductances and capacitances, and provides an effective low power way to control the spurious turn-on effect. By way of comparison, current control using an external gate driver is less effective, due to the parasitic capacitance and inductance between the gate driver and the first FET. Furthermore, the intrinsic capacitances of the low voltage switching device can be added to the gate capacitances $C_{GS}$ of the first FET to stabilize the gate voltage of the first FET and mitigate spurious turn-on without detrimentally impacting turn-off speed.

Figure 1:
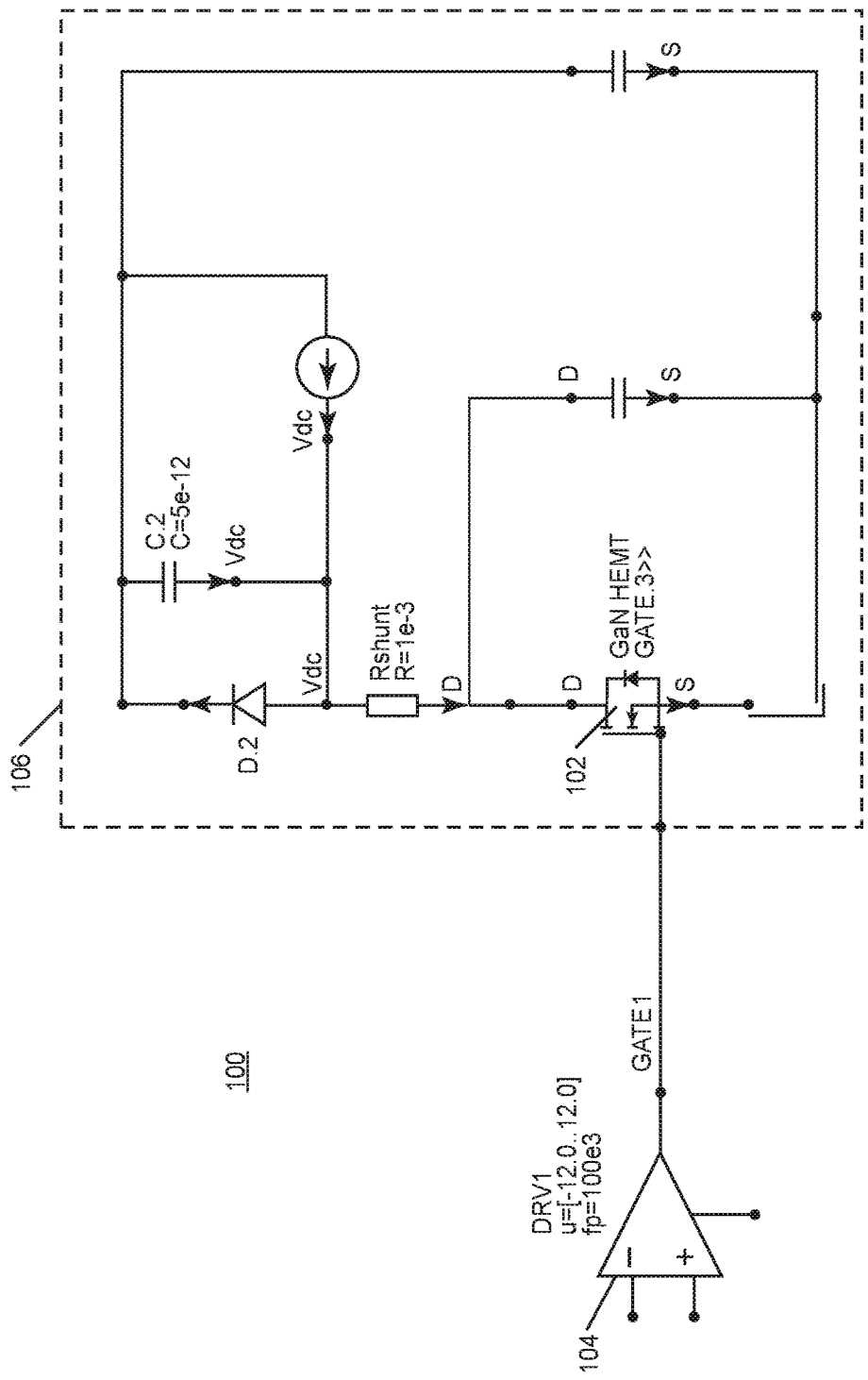
FIG. 1 illustrates a semiconductor assembly including a power switching device, according to the prior art.

Referring to FIG. 1, a semiconductor assembly 100 includes a first FET 102 and a first gate driver 104. According to an embodiment, the first FET 102 is a normally-off (i.e., enhancement mode) GaN based HEMT device. Alternatively, the first FET 102 can be any other kind of FET device, such as a silicon based MOSFET or IGBT. The first gate driver 104 is configured to generate a first control signal that transitions the first FET 102 between ON/OFF states in a commonly known manner. That is, the first gate driver 104 generates a high voltage (e.g., 4 V) that turns the first FET 102 ON and a low voltage (e.g., 0V) that turns the first FET 102 OFF. In the embodiment of FIG. 1, the first gate driver 104 is external to the semiconductor package 106 that the first FET 102 is provided in. For example, the semiconductor package 106 and the first gate driver 104 can both be part of an assembly that is connected by a printed-circuit-board (PCB). Alternatively, the first gate driver 104 can be incorporated in the semiconductor package 106.

Figure 2:
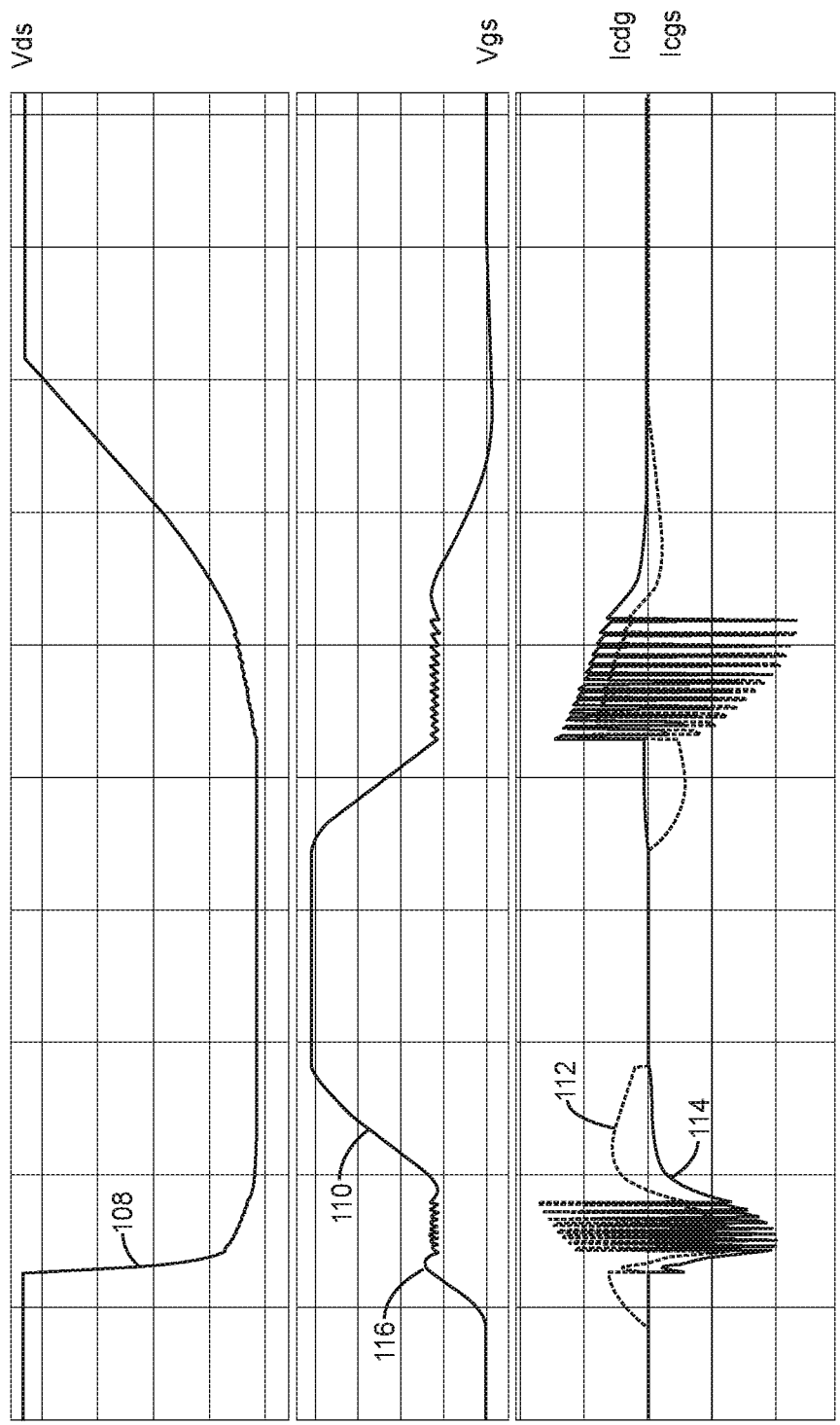
FIG. 2 illustrates voltage and current waveforms during a switching event of the semiconductor assembly of FIG. 1, according to the prior art.

Referring to FIG. 2, a switching operation of the semiconductor assembly 100 is depicted. The drain-source voltage 108 of the first FET 102 is represented by the uppermost curve. The gate-source voltage 110 of the first FET 102 is represented by the middle curve. The displacement current 112 in the gate-drain capacitor of the first FET 102 is represented by one of the lowermost curves and the displacement current 114 in the gate-source capacitor of the first FET 102 is represented by the other one of the lowermost curves.

Initially, the first FET 102 is turned OFF. At this time, gate-source voltage 110 is at 0V and a voltage of 400V is seen between the drain and source terminals of the first FET 102. This is just one example, and the phenomenon described herein can occur in a variety of devices under different conditions including switching voltages of 20V 200V, 400V, 600V or more. A turn ON operation of the first FET 102 is initiated by a rise in the gate-source voltage 110 of the first FET 102. This causes the first FET 102 to enter conduction mode. Consequently, a dramatic decline in the drain-source voltage 108 occurs. That is, the drain-source voltage 108 experiences a large dv/dt. This large dv/dt propagates across a capacitive voltage divider that includes the gate-source capacitance $C_{GS}$ of the first FET 102 and the gate-drain capacitance $C_{GD}$. In this example, the magnitude of the gate-source capacitance $C_{GS}$ of the first FET 102 is not large enough to absorb all of the charges associated with this dv/dt. As a result, the gate-source voltage 110 must decline to dissipate these excess charges away from the gate terminal of the first FET 102. This decline is shown by the downward movement 116 of the gate-source voltage 110.

The downward movement 116 of the gate-source voltage 110 is substantial enough to drop below the $V_{TH}$ of the first FET 102. As a result, the first FET 102 begins to turn OFF again. Thus, a "spurious turn-off" event occurs. As shown by the curves, the first FET 102 then oscillates between ON and OFF due to a feedback loop effect. Eventually, enough charges are dissipated away from the gate of the first FET 102 to break this feedback loop and maintain the first FET 102 in an ON state. The device remains in an ON state until a turn OFF operation occurs. During this time, a corresponding "spurious turn-on" event occurs due to the symmetry of the problem. As can be seen, the "spurious turn-off" and the "spurious turn-on" add significant delay to the switching operation and also result in substantial energy losses.

Figure 3:
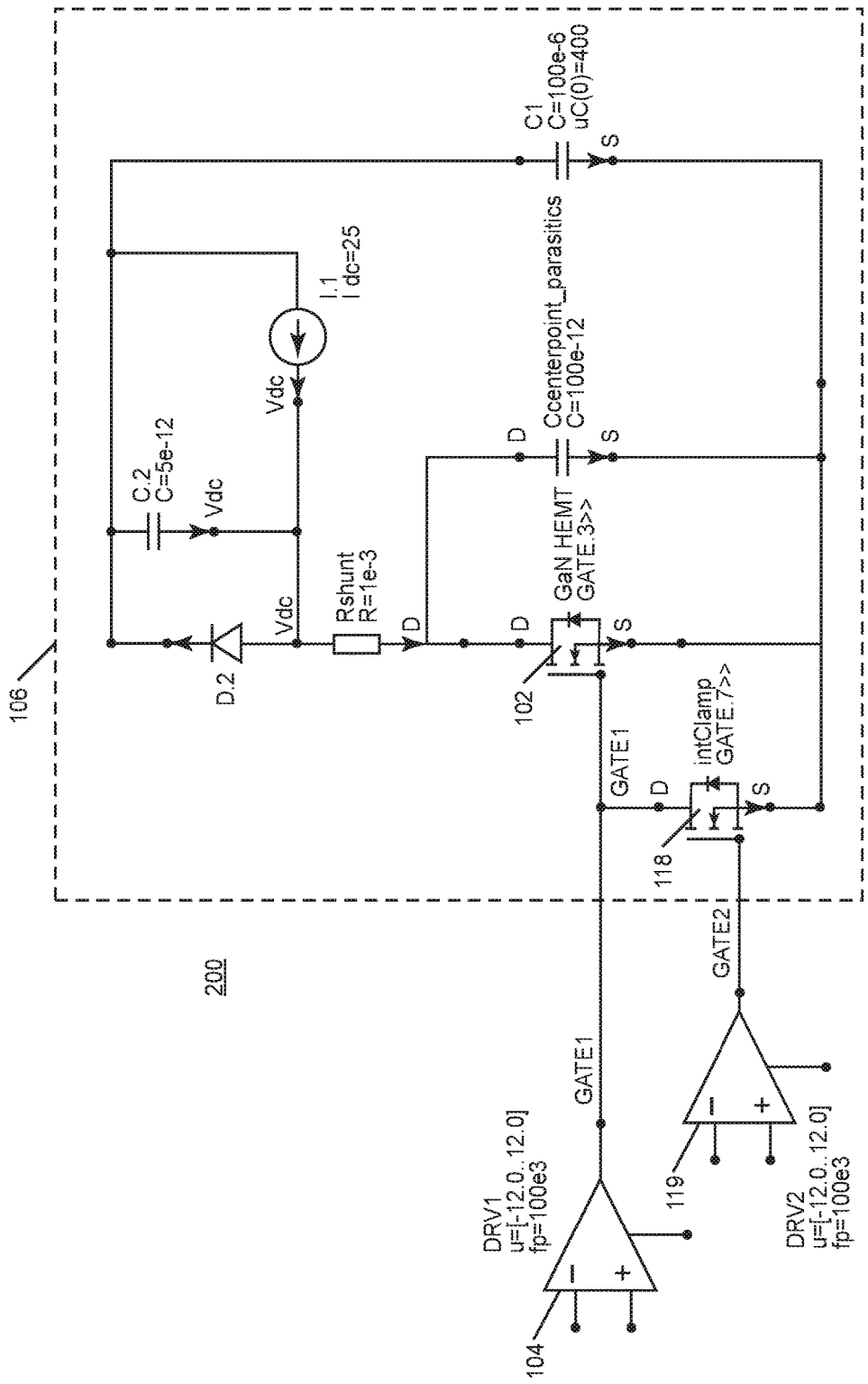
FIG. 3 illustrates a semiconductor assembly including a power switching device and a low-voltage switching device, according to an embodiment.

Referring to FIG. 3, semiconductor assembly 200 is depicted that is configured to mitigate the above described "spurious turn-on" effect. The semiconductor assembly 200 includes a semiconductor package 106 with the first FET 102 and a first gate driver 104 configured to control the operation of the first FET 102 as previously described. Additionally, a low voltage switching device 118 is provided within the semiconductor package 106. The low voltage switching device 118 can be any of a variety of switching devices. According to one embodiment, the low voltage switching device 118 is a GaN based HEMT. Likewise, the first FET 102 is a GaN based HEMT. Alternatively, the low voltage switching device 118 can be any other kind of switching device, such as a silicon based FET.

The properties of the low voltage switching device 118 are correlated to the properties of the first FET. Correlated refers to a proportional relationship, e.g., 2×, 5×, etc. One such correlation is between the $V_{TH}$ of the first FET 102 and the reverse blocking rating of the low voltage switching device 118. Unlike the first FET 102, the low voltage switching device 118 is only required to block sufficient voltage to maintain the first FET 102 above or below threshold. Thus, the reverse blocking rating of the first FET 102 can be as low as two times the threshold voltage of the first FET 102 (i.e., a reverse blocking rating of 8V in the case that the first FET has a $V_{TH}$ of 4V). In one embodiment, the reverse blocking rating of the low voltage switching device 118 is five times the threshold voltage of the first FET 102.

Another correlation is between the voltage drop of the first FET 102 and the threshold voltage of the first FET 102 under any operational conditions. The voltage drop is defined as the $R_{DSON}$ (on-resistance) of the low voltage switching device 118 multiplied by the maximum displacement current of the first FET 102. Maintaining this correlation ensures that the low voltage switching device 118 can be turned ON without inadvertently turning the first FET 102 ON. The low voltage switching device 118 is considered "low voltage" because it is not required to block substantially large voltages, e.g., the voltages of 200V, 400V or more that the first FET 102 can be designed to accommodate. The above described properties can be achieved by a relatively small device (in comparison to the first FET 102) that dissipates very little power.

The low voltage switching device 118 has its drain and source terminals connected across the gate and source terminals of the first FET 102. Thus, when the low voltage switching device 118 is turned ON, the gate terminal of the first FET 102 is connected to the source terminal of the first FET 102 and the gate-source capacitance of the first FET 102 is electrically shorted. In the depicted embodiment, the drain of the low voltage switching device 118 is connected to the gate of the first FET 102 and the source of the low voltage switching device 118 is connected to the source of the first FET 102. However, if the gate-source blocking capability of the low voltage switching device is sufficient, the orientation can be reversed, with the source of the low voltage switching device 118 being connected to the gate of the first FET 102 and the drain of the low voltage switching device 118 being connected to the source of the first FET 102.

The assembly of FIG. 3 further includes a second gate driver 119 disposed outside of the semiconductor package 106 that is connected to the gate terminal of the low voltage switching device 118. The second gate driver 119 is configured to generate a second control signal that is different from the first control signal and controls a conductive state of the low voltage switching device 118. Thus, the second control signal can be used to short the gate-source capacitance of the first FET 102 independent from or out of phase with the switching operation of the first FET 102.

Figure 4:
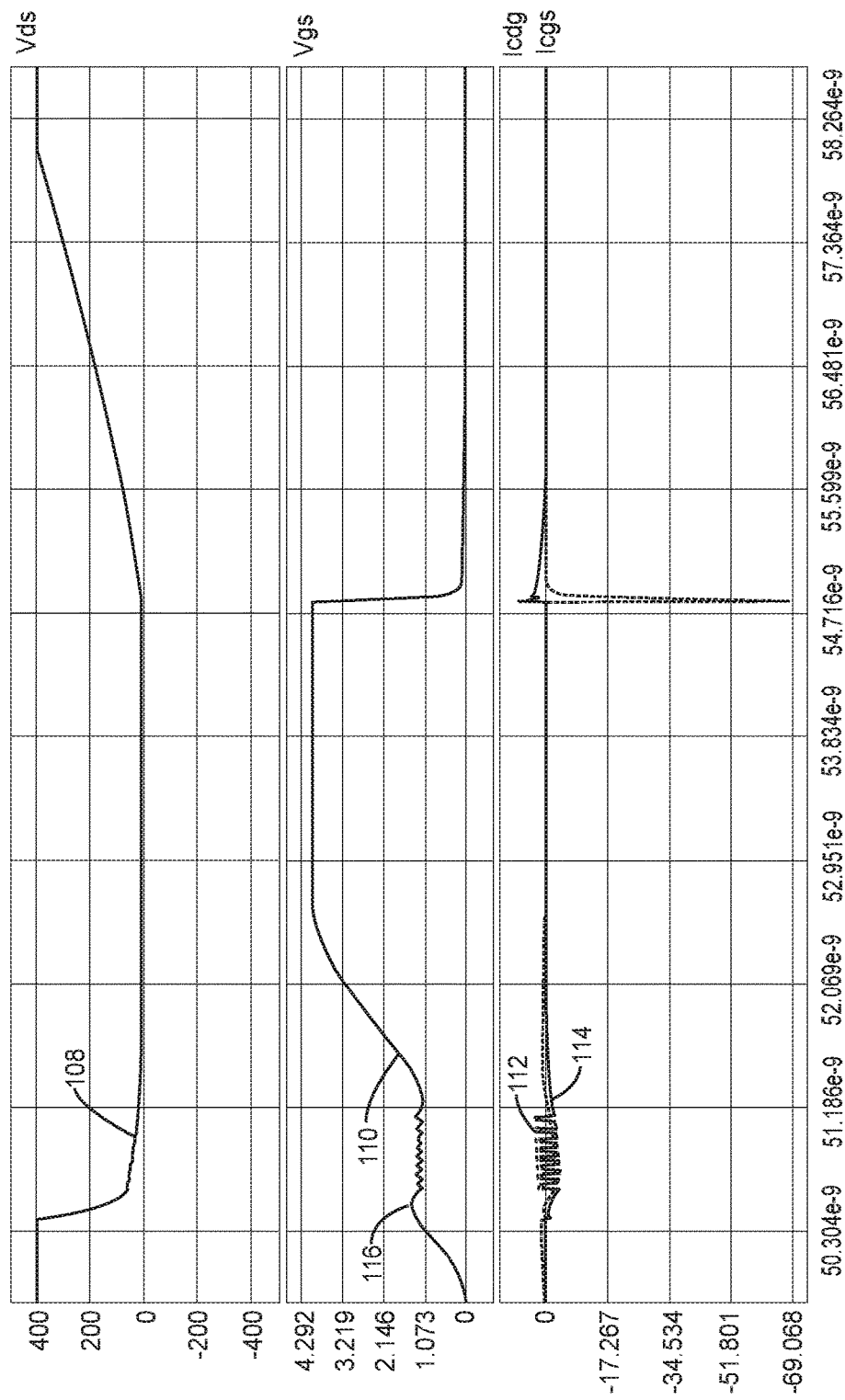
FIG. 4 illustrates voltage and current waveforms during a switching event of the semiconductor assembly of FIG. 4, according to an embodiment.

Referring to FIG. 4, a switching operation of the semiconductor assembly 200 is depicted. The drain-source voltage 108, gate-source voltage 110 and displacement currents of 112, 114 as previously described with reference to FIG. 2 are correspondingly represented in FIG. 4. In this embodiment, first FET 102 is turned ON in a similar manner as described with reference to FIG. 2 and a similar spurious turn-off is observed. However, when the first FET 102 is turned OFF, a spurious turn-on condition is avoided. When the first FET 102 is turned OFF, the low voltage switching device 118, which is controlled by the second control signal (not shown), is turned ON, and the gate-source capacitance $C_{GS}$ of the first FET 102 is electrically shorted. As a result, the charges appearing at the gate of the first FET 102 are rapidly dissipated by the low voltage switching device 118 and the gate voltage can transition smoothly from high to low.

Figure 5:
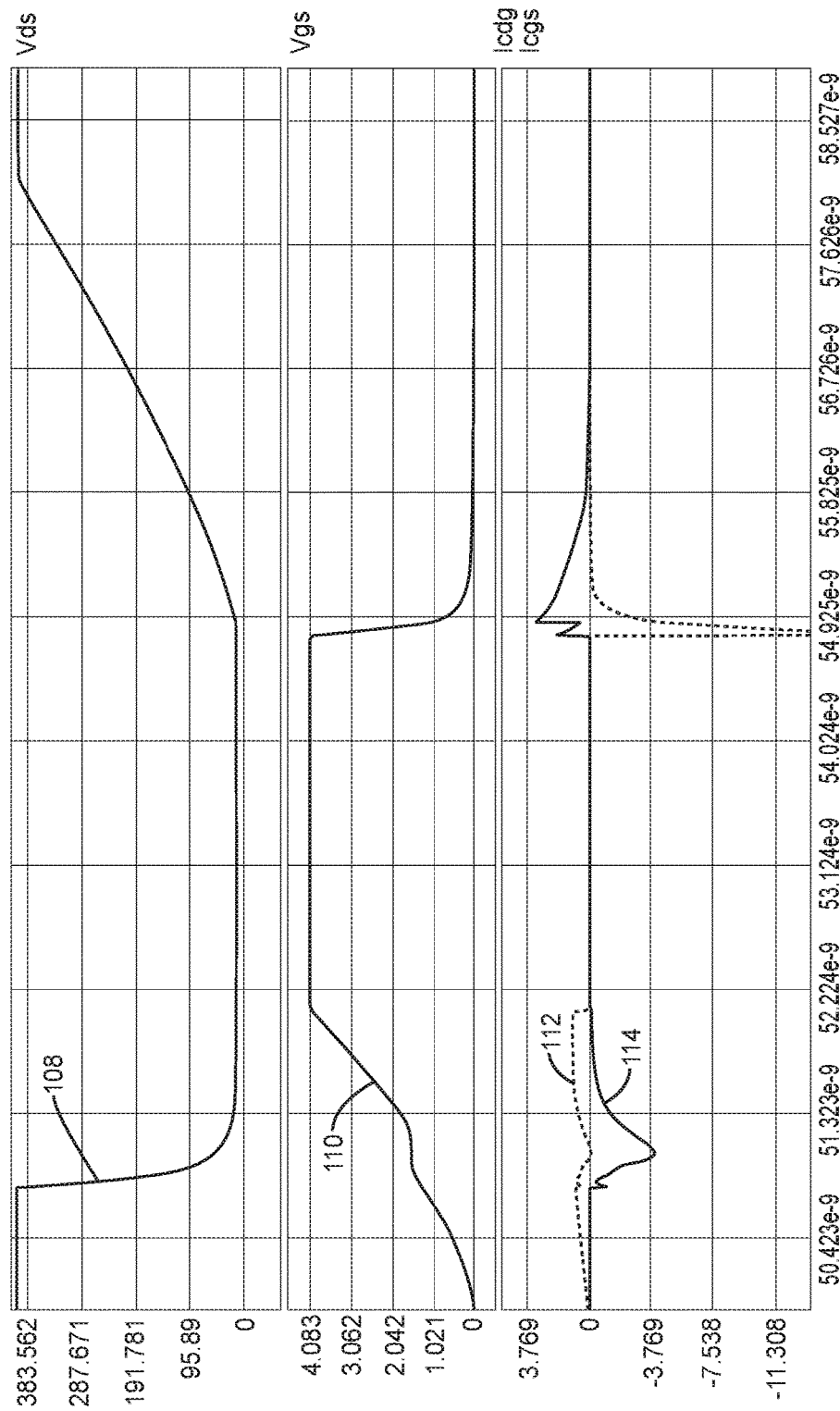
FIG. 5 illustrates voltage and current waveforms during a switching event of the semiconductor assembly of FIG. 4, according to an embodiment.

Referring to FIG. 5, a switching operation of the semiconductor assembly arrangement 200 is depicted, according to another embodiment. The semiconductor assembly 200 used in FIG. 5 has been modified so that the spurious turn ON no longer occurs. More particularly, the gate-source capacitance of the first FET 102 has been intentionally increased (e.g., by 3×) in comparison to the gate-source capacitance of the first FET 102 used in FIG. 4. This can be done using a discrete capacitor or by altering the gate structure of the first FET 102. Moreover, as the low voltage switching device 118 is connected between the gate and source terminals of the first FET 102, the intrinsic capacitances associated with the first FET 102 (e.g., $C_{DS}$, $C_{GS}$, etc.) increase the $C_{GS}$ value in the capacitive voltage divider of the first FET 102. As a result, the gate-source voltage 110 remains above threshold and the device stays ON.

Figure 6:
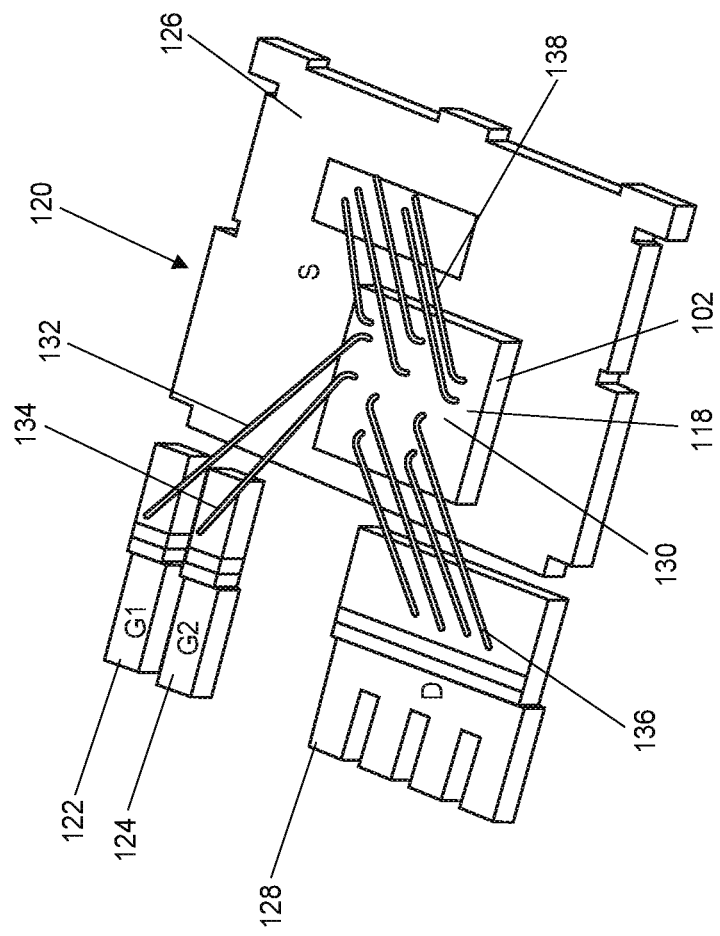
FIG. 6 illustrates a semiconductor package with a low-voltage switching device and a power HEMT integrated within the semiconductor package, according to an embodiment.

Referring to FIG. 6, a configuration of the semiconductor package 106 is depicted, according to an embodiment. The semiconductor package 106 includes a lead frame 120. The lead frame 120 is made of an electrically conductive material such as Cu, Al, etc. and alloys thereof. The lead frame 120 includes four leads: a first gate lead 122, a second gate lead 124, a source lead 126 and a drain lead 128. Each of these leads 122, 124, 126, 128 are electrically isolated and disconnected from one another. That is, each of the leads 122, 124, 126, 128 form separate electrical nodes.

A first die 130 is mounted to the lead frame 120. In this embodiment, the first die 130 includes both the first FET 102 and the low voltage switching device 118. For example, the first die 130 can be a GaN chip, wherein both the first FET 102 and the low voltage switching device 118 are configured as GaN devices. The connection between the drain terminal of the low voltage switching device 118 and the gate terminal of the first FET 102 is provided by chip-level interconnect of the first die 130. Thus, the parasitic capacitance at this connection is minimal. The rest of the electrical connections can be provided by package level interconnect. In the depicted embodiment, a first bond wire 132 (or wires) connects the gate terminal of the first FET 102 to the first gate lead 122, a second bond wire 134 (or wires) connects the gate terminal of the low voltage switching device 118 to the second gate lead 124, a third bond wire 136 (or wires) connects the drain terminal of the first FET 102 to the drain lead 128, and a fourth bond wire 138 (or wires) connect the source terminals of both devices to the source lead 126. Alternatively, any other package level connection technique may be employed. For example, PCB or clips may be used to connect the terminals of the first die 130 with the proper external leads of the semiconductor package 106.

Figure 7:
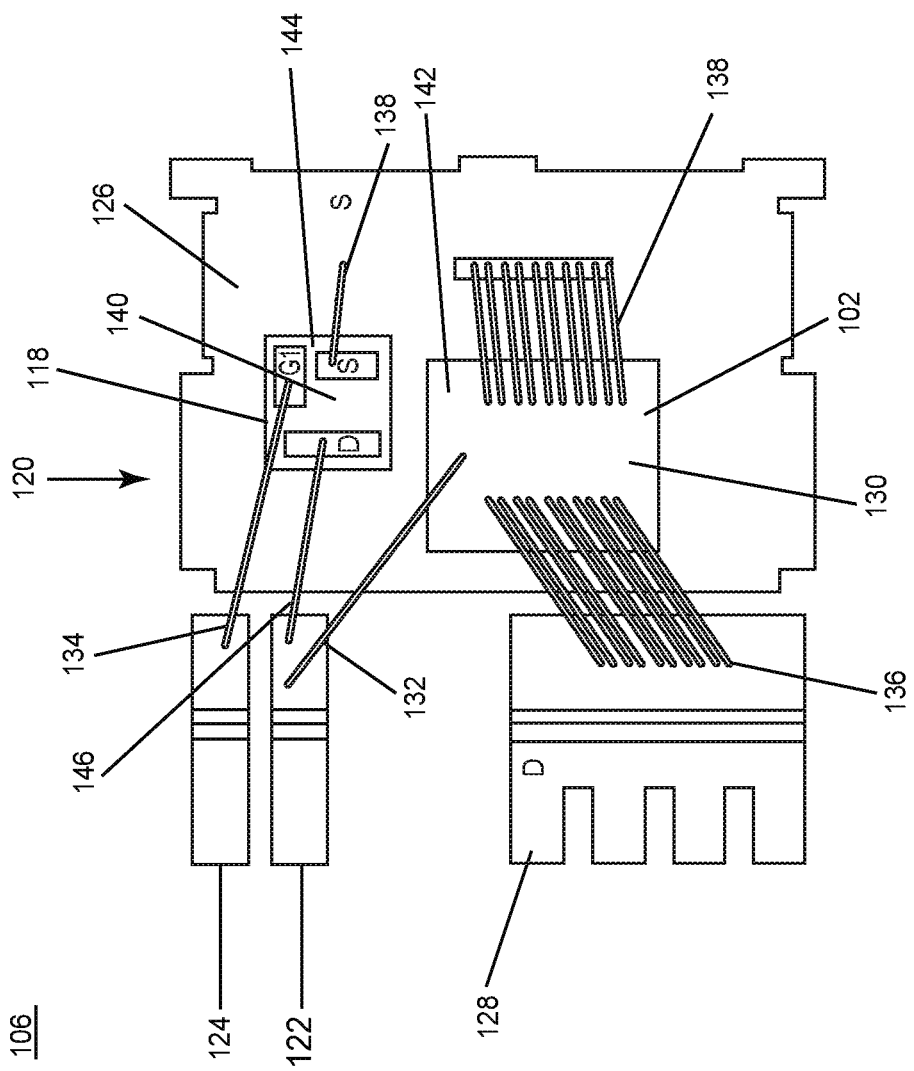
FIG. 7 illustrates a semiconductor package with a low-voltage switching device and a power HEMT integrated within the semiconductor package, according to another embodiment.

Referring to FIG. 7, a configuration of the semiconductor package 106 is depicted, according to another embodiment. In the embodiment of FIG. 7, the first FET 102 and the low voltage switching device 118 are implemented in two separate dies. More particularly, the first FET 102 is monolithically integrated in a first die 130 and the low voltage switching device 118 is monolithically integrated in a second die 140 that is adjacent the first die 130. Both the first and second dies 130, 140 are mounted on the lead frame 120 with lower sides directly connected to and facing the lead frame 120. Upper sides 142, 144 of the first and second dies 130, 140 that are opposite from the lower sides face away from the lead frame 120. Both the first FET 102 and the low voltage switching device 118 are configured as lateral devices, with gate, source and drain terminals of each switching device being disposed on the upper sides 142, 144 of the respective die. For example, this configuration may be realized if both the first FET 102 and the low voltage switching device 118 are normally-off lateral HEMT devices. The first, second, third and fourth bond wires 132, 134, 136 and 138 are connected in a similar manner as described with reference to FIG. 7. Additionally, a fifth bonding wire 146 provides the electrical connection between the drain terminal of the low voltage switching device 118 and the gate terminal of the first FET 102. The fifth bonding wire 146 connects the drain terminal of the low voltage switching device 118 to the first gate lead 122, which in turn is connected to the gate terminal of the first FET 102. As a result, each of the electrical connections between the first die 130, the second die 140 and the lead frame 120 are provided by package-level bond wires. Alternatively, any of the bonding wires depicted in FIG. 7 can be replaced by other forms of package level interconnect, such as PCB or clips.

Figure 8:
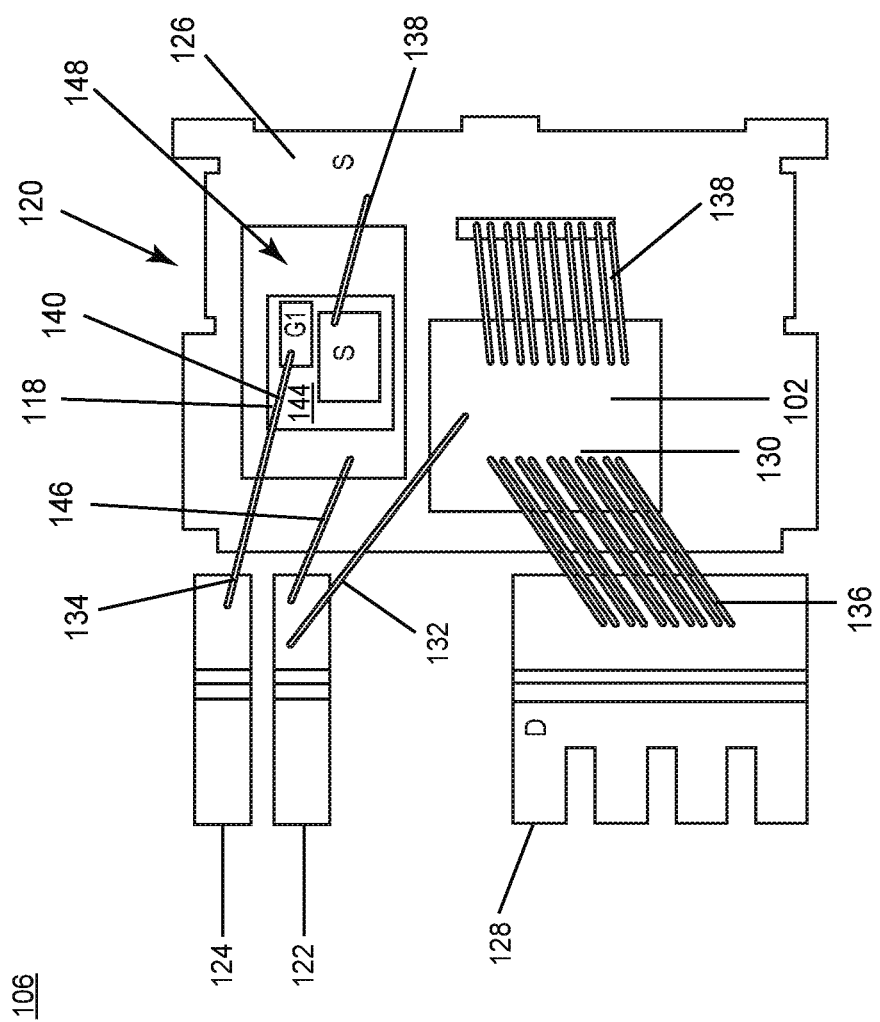
FIG. 8 illustrates a semiconductor package with a low-voltage switching device and a power HEMT integrated within the semiconductor package, according to another embodiment.

Referring to FIG. 8, a configuration of the semiconductor package 106 is depicted, according to another embodiment. In the embodiment of FIG. 8, the low voltage switching device 118 is implemented as a vertical MOSFET. The gate and source terminals of the low voltage switching device 118 are disposed on the upper side 144 of the second die 140 and the drain terminal of the low voltage switching device 118 is disposed on a lower side of the second die 140. Because the drain terminal of the second die 140 faces the lead frame 120, electrical isolation between the second semiconductor die and the lead frame 120 is needed to prevent the drain of the low voltage switching device 118 from being shorted to the source of the first FET 102. This electrical isolation is provided by a DCB (direct copper bond) substrate 148 that is disposed between the lower side of the second die 140 and the lead frame 120. A fifth bonding wire 146 is connected between the DCB (direct copper bond) substrate and the first gate lead 122.

Figure 9:
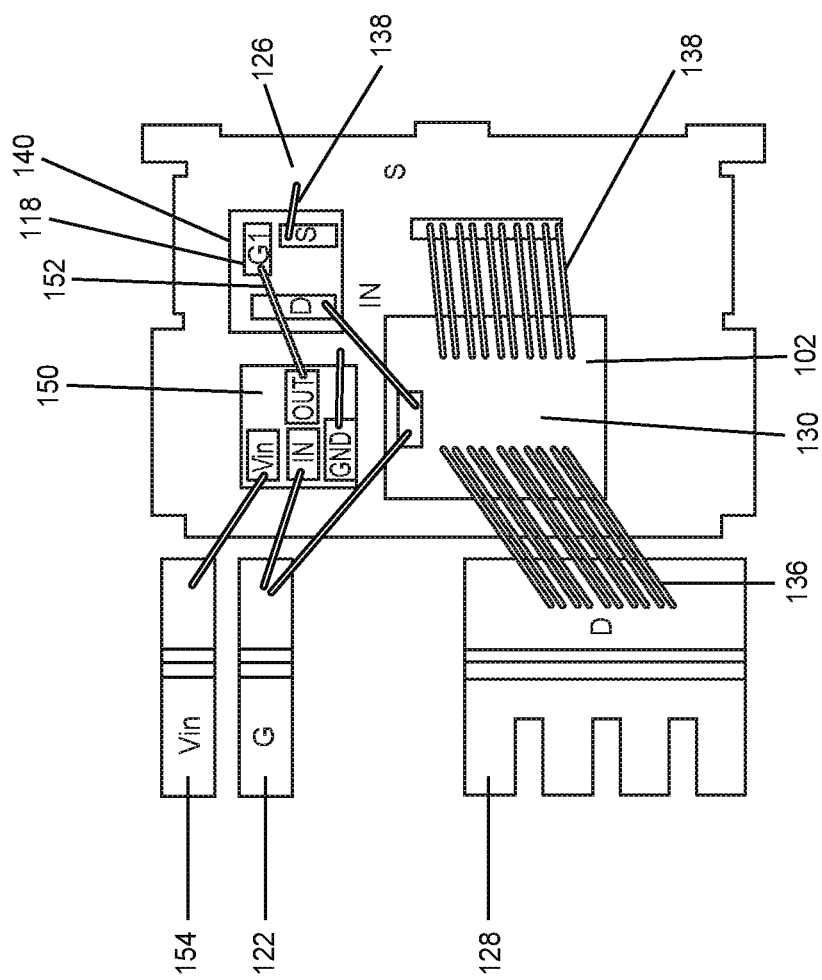
FIG. 9 illustrates a semiconductor package with a low-voltage switching device and a power HEMT integrated within the semiconductor package, according to another embodiment.

Referring to FIG. 9, a configuration of the semiconductor package 106 is depicted, according to another embodiment. The semiconductor package 106 of FIG. 9 differs from the previous embodiments in that it includes an inverter incorporated within the package 106. According to the depicted embodiment, the inverter is provided by a third die 150 that is mounted adjacent to the first and second dies 130, 140. The low voltage switching device 118 and the first FET 102 are incorporated in the first and second dies 130, 140 as previously discussed. Alternatively, the inverter can be integrated into one of the first and second dies 130, 140. An input terminal of the inverter is electrically connected to the first gate lead 122. Thus, the inverter receives the same input signal as the first FET 102. An output terminal of the inverter is electrically connected to the gate terminal of the low voltage switching device 118 by a sixth bonding wire 152. The inverter can receive a power supply from a separate lead 154 of the lead frame.

The configuration of FIG. 9 uses the signal that is applied to the first gate lead to provide the first and second control signals for the first FET 102 and the low voltage switching device 118, respectively. In this case, the second control signal is the logical complement of the first control signal. That is, the low voltage switching device 118 is turned OFF when the first FET 102 is turned on, and vice-versa. As a result, the second gate driver 119 depicted in FIG. 3 can be eliminated from the parent circuit and the first gate driver 104 can be used to control both the first FET 102 and the low voltage switching device 118. Moreover, the second gate lead 124 can be eliminated from the lead frame, as both the first FET 102 and the low voltage switching device 118 receive their control signals (either directly or indirectly) from the first gate lead 122. Other solutions may be implemented to achieve a corresponding functionality and eliminate one of the gate leads. For instance, instead of providing the inverter, the low voltage switching device 118 can be implemented as a normally-on JFET device in which a positive voltage turns the device OFF. That is, low voltage switching device 118 can be configured in a complementary manner as the FET 102. In this way, when one is OFF the other is ON and vice-versa. In this case, the gates of both the low voltage switching device 118 and the FET 102 can be directly connected to the first gate lead 122.

Figure 10:
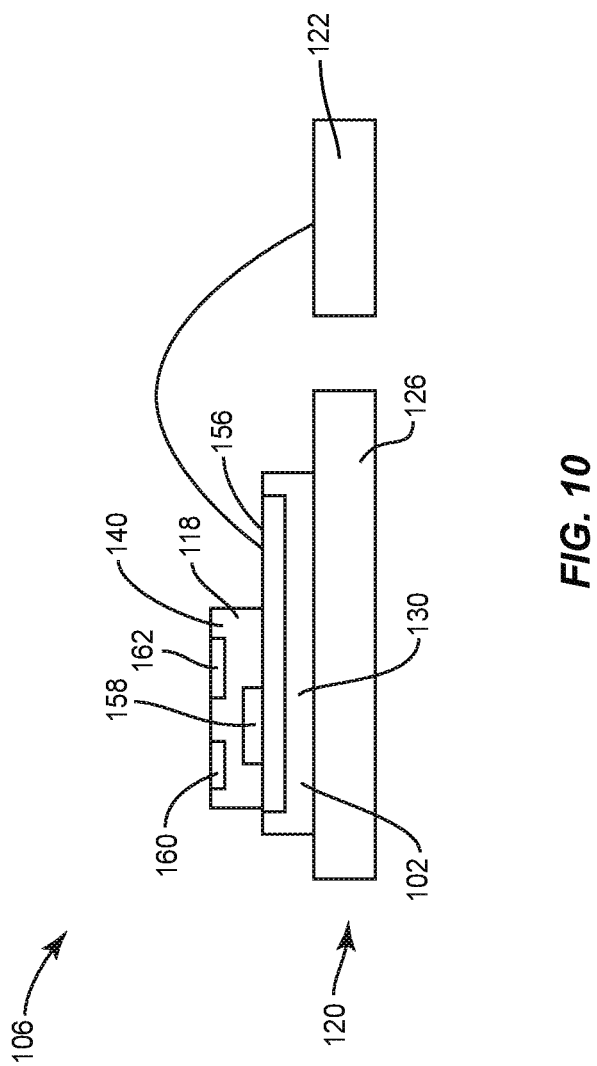
FIG. 10 illustrates a semiconductor package with a low-voltage switching device and a power HEMT integrated within the semiconductor package, according to another embodiment.

Referring to FIG. 10, a side-view of the semiconductor package 106 is depicted, according to another embodiment. In this embodiment, the first FET 102 and the low voltage switching device 118 are implemented in first and second (separate) dies 130, 140. However, different from the previous embodiments, in this embodiment the second die 140 that includes the low voltage switching device 118 is mounted directly on the first die 130 that includes the first FET 102. The second die 140 includes a gate terminal 156 that is sufficiently large to accommodate a connection with the second die 140 as well as an area for the connection of the first bond wire 132 (or wires) that connects the gate terminal 156 of the first FET 102 to the first gate lead 122. The second die 140 is configured with the drain terminal 158 of the low voltage switching device 118 disposed on one side and the source and gate terminals 162 facing an opposite side. The drain terminal 158 directly connects to the gate terminal 156 of the first FET 102, thereby providing an electrical connection with minimal parasitic capacitance. The other connections (not shown) can be made in a similar manner as previously discussed.

Spatially relative terms such as "under," "below," "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor assembly, comprising:
   a first FET integrated within the semiconductor assembly and comprising gate, source and drain terminals;
   a switching device integrated within the semiconductor assembly and being configured to electrically short a gate-source capacitance of the first FET responsive to a control signal,
   a first gate lead, a second gate lead, a drain lead, and a source lead, each of the first gate lead, the second gate lead, the drain lead, and the source lead forming externally accessible terminals of the semiconductor assembly,
   wherein a reverse blocking rating of the switching device is less than a reverse blocking rating of the first FET;
   wherein a gate of the first FET is directly electrically connected to the first gate lead,
   wherein a gate of the switching device is directly electrically connected to the second gate lead, and wherein the first FET and the switching device are the only active semiconductor devices connected between the first gate lead, the second gate lead, the drain lead, and the source lead, wherein the semiconductor assembly comprises a semiconductor package, comprising an electrically conductive lead frame, the lead frame comprising the first gate lead, the second gate lead, the drain lead, and the source lead.

2. The semiconductor assembly of claim 1, wherein a forward voltage drop of the switching device is less than a threshold voltage of the first FET.

3. The semiconductor assembly of claim 1, wherein the first FET is a normally-off HEMT, and wherein the switching device is a transistor comprising gate, source and drain terminals, and wherein the source and drain terminals of the low voltage switching device are connected to the gate and drain terminals of the first FET.

4. The semiconductor assembly of claim 3, wherein the first FET and the switching device are monolithically integrated in a single die, and wherein the connection between the drain terminal of the low voltage switching device and the gate terminal of the first FET is provided by an interconnect that is internal to the single die.

5. The semiconductor assembly of claim 4, wherein the first FET is monolithically integrated in a first die that is mounted on the lead frame and the switching device is monolithically integrated in a second die that is mounted on the lead frame.

6. The semiconductor assembly of claim 5, wherein the first die is mounted directly on the lead frame and the second die is mounted directly on the lead frame adjacent the first die.

7. The semiconductor assembly of claim 6, wherein the first die is mounted directly on the lead frame and the second die is mounted directly on the first die.

8. The semiconductor assembly of claim 7, wherein the switching device is a normally-off lateral HEMT, and wherein the gate, source and drain terminals of the switching device are disposed on an upper side of the second die that faces away from the lead frame.

9. The semiconductor assembly of claim 7, wherein the switching device is a vertical MOSFET, wherein the gate and source terminals of the switching device are disposed on an upper side of the second die that faces away from the lead frame, wherein the drain terminal of the switching device is disposed on a lower side of the second die that faces the lead frame, and wherein the semiconductor package further comprises a DCB substrate disposed between the lower side of the second die and the lead frame.

10. The semiconductor assembly of claim 1, further comprising:
a first gate driver disposed outside of the semiconductor package and configured to generate a first control signal that controls an ON/OFF state of the first FET.

11. The semiconductor assembly of claim 10, further comprising:
a second gate driver disposed outside of the semiconductor package and configured to generate a second control signal that controls an ON/OFF state of the switching device.

* * * * *